United States Patent
Tang et al.

(10) Patent No.: US 11,955,479 B2
(45) Date of Patent: Apr. 9, 2024

(54) PACKAGED SEMICONDUCTOR DEVICE

(71) Applicant: Texas Instruments Incorporated, Dallas, TX (US)

(72) Inventors: Yiqi Tang, Allen, TX (US); Rajen Manicon Murugan, Dallas, TX (US); Makarand Ramkrishna Kulkarni, Dallas, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 16/667,051

(22) Filed: Oct. 29, 2019

(65) Prior Publication Data
US 2020/0066716 A1 Feb. 27, 2020

Related U.S. Application Data

(63) Continuation of application No. 16/037,695, filed on Jul. 17, 2018, now Pat. No. 10,475,786.

(60) Provisional application No. 62/675,396, filed on May 23, 2018.

(51) Int. Cl.
| | | |
|---|---|---|
| *H01L 27/07* | (2006.01) | |
| *H01L 23/00* | (2006.01) | |
| *H01L 23/31* | (2006.01) | |
| *H01L 23/522* | (2006.01) | |
| *H05K 1/02* | (2006.01) | |

(52) U.S. Cl.
CPC ...... *H01L 27/0733* (2013.01); *H01L 23/3128* (2013.01); *H01L 23/5226* (2013.01);
(Continued)

(58) Field of Classification Search
CPC . H01L 2924/00014; H01L 2924/16235; H01L 2224/73215; H01L 2224/8592;
(Continued)

(56) References Cited

U.S. PATENT DOCUMENTS

| | | | | | |
|---|---|---|---|---|---|
| 4,500,854 | A | * | 2/1985 | Meyer | H03B 5/1847 331/107 SL |
| 6,067,053 | A | * | 5/2000 | Runyon | H01Q 1/246 343/700 MS |

(Continued)

OTHER PUBLICATIONS

WO2018/119153 2A (Alpman et al) priority date Dec. 21, 2016. (Year: 2016).*

*Primary Examiner* — Jay C Chang
*Assistant Examiner* — Mikka Liu
(74) *Attorney, Agent, or Firm* — Ronald O. Neerings; Frank D. Cimino

(57) ABSTRACT

A packaged semiconductor device includes a molded interconnect substrate having a signal layer including a first channel and a second channel on a dielectric layer with vias, and a bottom metal layer for providing a ground return path. The signal layer includes contact pads, traces of the first and second channel include narrowed trace regions, and the bottom metal layer includes a patterned layer including ground cut regions. DC blocking capacitors are in series within the traces of the first and second channel for providing AC coupling that have one plate over one of the ground cuts. An integrated circuit (IC) includes a first and a second differential input channel coupled to receive an output from the DC blocking capacitors, with a bump array thereon flip chip mounted to the contact pads to provide first and second differential output signals.

43 Claims, 6 Drawing Sheets

(52) U.S. Cl.
CPC .............. *H01L 24/09* (2013.01); *H01L 24/17* (2013.01); *H05K 1/0231* (2013.01); *H01L 2924/15311* (2013.01); *H05K 2201/09118* (2013.01)

(58) Field of Classification Search
CPC ........... H01L 2224/92165; H01L 24/32; H01L 24/73; H01L 27/14618; H01L 27/1462; H01L 24/17; H01L 23/5226; H01L 23/3128; H01L 27/0733; H01L 23/49833; H01L 23/49822; H01L 2924/181; H01L 2924/15159; H01L 29/5226; H05K 2201/09118; H05K 1/0231; H05K 1/0243
See application file for complete search history.

(56) References Cited

U.S. PATENT DOCUMENTS

| | | | | |
|---|---|---|---|---|
| 2005/0208278 | A1* | 9/2005 | Landi | ...................... H05K 3/386 |
| | | | | 428/209 |
| 2006/0091982 | A1* | 5/2006 | Berg | ........................ H01P 3/003 |
| | | | | 333/236 |
| 2006/0097736 | A1* | 5/2006 | Oldrey | ............. G01R 31/31905 |
| | | | | 324/756.05 |
| 2008/0080155 | A1* | 4/2008 | Ye | ........................ H05K 1/0248 |
| | | | | 361/777 |
| 2009/0058552 | A1* | 3/2009 | Oiwa | .................. H04L 27/0002 |
| | | | | 333/32 |
| 2009/0255720 | A1* | 10/2009 | Lu | ......................... H05K 1/0253 |
| | | | | 174/262 |
| 2009/0310509 | A1* | 12/2009 | Kumai | .................. H04W 48/18 |
| | | | | 370/254 |
| 2013/0235542 | A1* | 9/2013 | Song | ..................... H05K 1/0243 |
| | | | | 361/773 |
| 2014/0176266 | A1* | 6/2014 | Kato | ....................... H01P 3/088 |
| | | | | 333/238 |
| 2015/0381122 | A1 | 12/2015 | Musa et al. | |
| 2016/0358838 | A1 | 12/2016 | Basler et al. | |
| 2017/0373011 | A1* | 12/2017 | Gowda | ................ H01L 23/5227 |
| 2017/0373757 | A1* | 12/2017 | Miki | ...................... H04B 10/40 |
| 2018/0190580 | A1 | 7/2018 | Haba et al. | |
| 2018/0254252 | A1 | 9/2018 | Nakagawa et al. | |
| 2019/0006999 | A1* | 1/2019 | Kim | ........................ H01L 23/66 |
| 2020/0091608 | A1* | 3/2020 | Alpman | ................. H01Q 21/24 |

\* cited by examiner

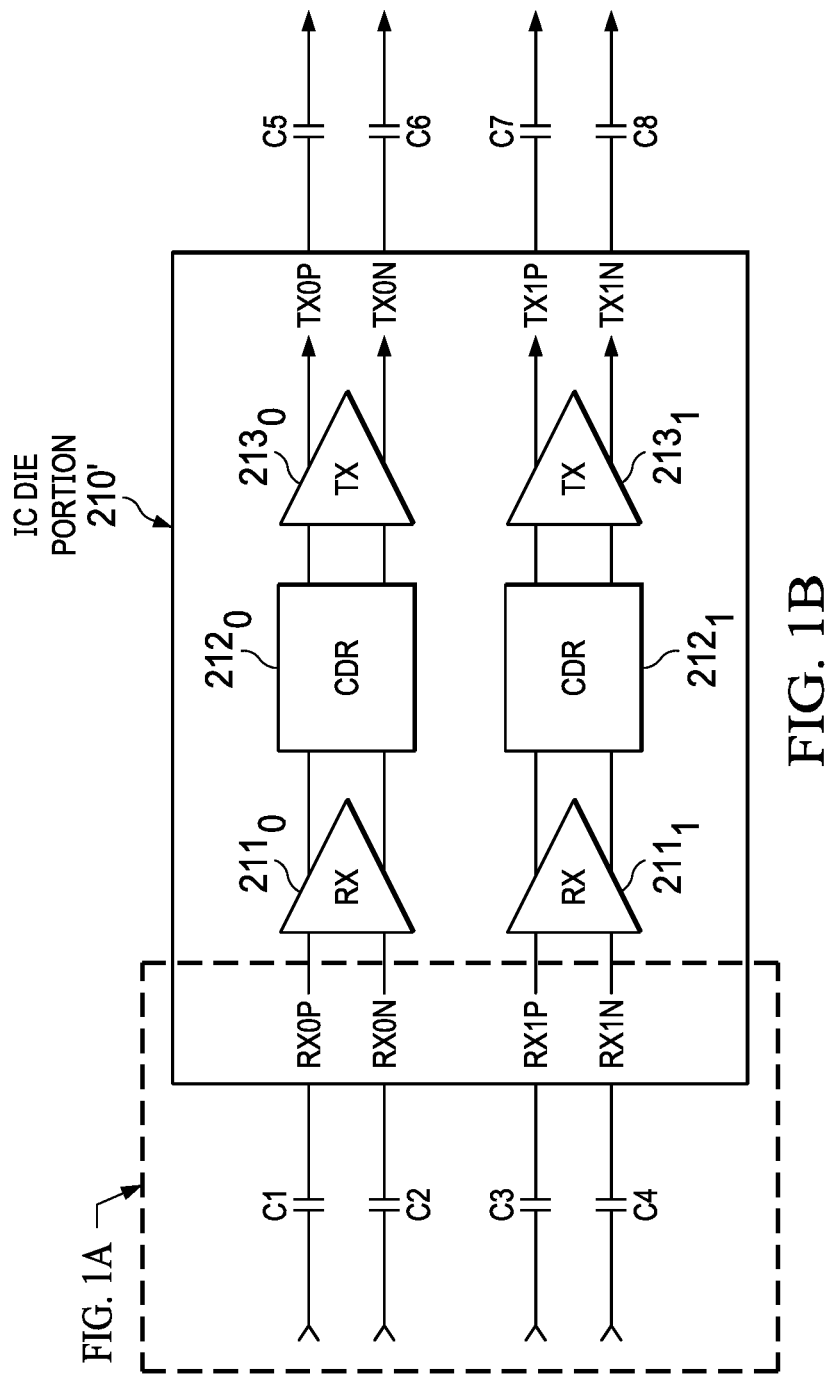

PACKAGED SEMICONDUCTOR DEVICE

CROSS REFERENCE TO RELATED APPLICATIONS

This application is a Continuation of application Ser. No. 16/037,695 filed Jul. 17, 2018, which claims the benefit of Provisional Application Ser. No. 62/675,396 entitled "MIS Multi-Layer FC-QFN Package Structure for High Speed (56 Gbps+) Applications", filed May 23, 2018, which is hereby incorporated by reference in its entirety.

FIELD

This Disclosure relates to high speed packaged semiconductor devices.

BACKGROUND

Some high speed signal/data devices such as re-timer circuits, repeaters, and clock synthesizers are high volume and medium-high pin count devices which are typically packaged in flip chip ball grid array (FC BGA) packages, which are relatively high cost packages. A cost-effective alternative is a wirebond BGA package. However the electrical performance of a wirebond BGA package at high speed (>5 Gigabits per second (Gbps)) is relatively poor, such as having a poor insertion loss and poor return loss.

Integrated circuit (IC) packages can be based on an emerging technology called a molded interconnect substrate (MIS). A MIS starts with a specialized substrate material for select IC packages. The MIS itself is developed and sold by various vendors, and a packaging house then generally takes the MIS and assembles an IC package around it including adding molding. Some refer to the MIS as a leadframe.

MIS is different than traditional substrates, as MIS technology comprises a pre-molded structure with one or more metal layers. Each layer is pre-configured generally with at least a top and a bottom copper plating layer with a dielectric layer between copper layers having vias to provide an electrical connections in the package.

SUMMARY

This Summary is provided to introduce a brief selection of disclosed concepts in a simplified form that are further described below in the Detailed Description including the drawings provided. This Summary is not intended to limit the claimed subject matter's scope.

Disclosed aspects solve the problem of the high cost of FC BGA packages for high speed devices because of the need to meet high electrical performance (e.g., a 56 Gbps or more data rate) by developing a physical structure plus in-package DC blocking capacitors to provide a less expensive MIS QFN technology that has the MIS tuned to deliver similar performance to a conventional FC BGA package. The disclosed performance tuning comprises narrowing the respective traces on the signal layer (e.g., negative (N) signal traces and positive (P) signal traces for each channel) and providing a bottom metal layer with ground cuts, where the narrowed signal traces extend over the ground cuts and the DC blocking capacitors each have one plate over a ground cut.

Disclosed aspects include a packaged semiconductor device includes a molded interconnect substrate having a signal layer including a first channel and a second channel on a dielectric layer with vias, and a bottom metal layer for providing a ground return path. The signal layer includes contact pads, traces of the first and second channel include narrowed trace regions, and the bottom metal layer includes a patterned layer including ground cut regions. DC blocking capacitors are in series within the traces of the first and second channel for providing AC coupling, where the DC blocking capacitors have one plate over one of the ground cuts. An IC includes a first and a second differential input channel coupled to receive an output from the DC blocking capacitors, with a bump array thereon flip chip mounted to the contact pads to provide first and second differential output signals.

BRIEF DESCRIPTION OF THE DRAWINGS

Reference will now be made to the accompanying drawings, which are not necessarily drawn to scale, wherein:

FIG. 1B is a schematic of a portion of a packaged MIS QFN-based semiconductor device shown in FIG. 1A.

DETAILED DESCRIPTION

Figure 1A:
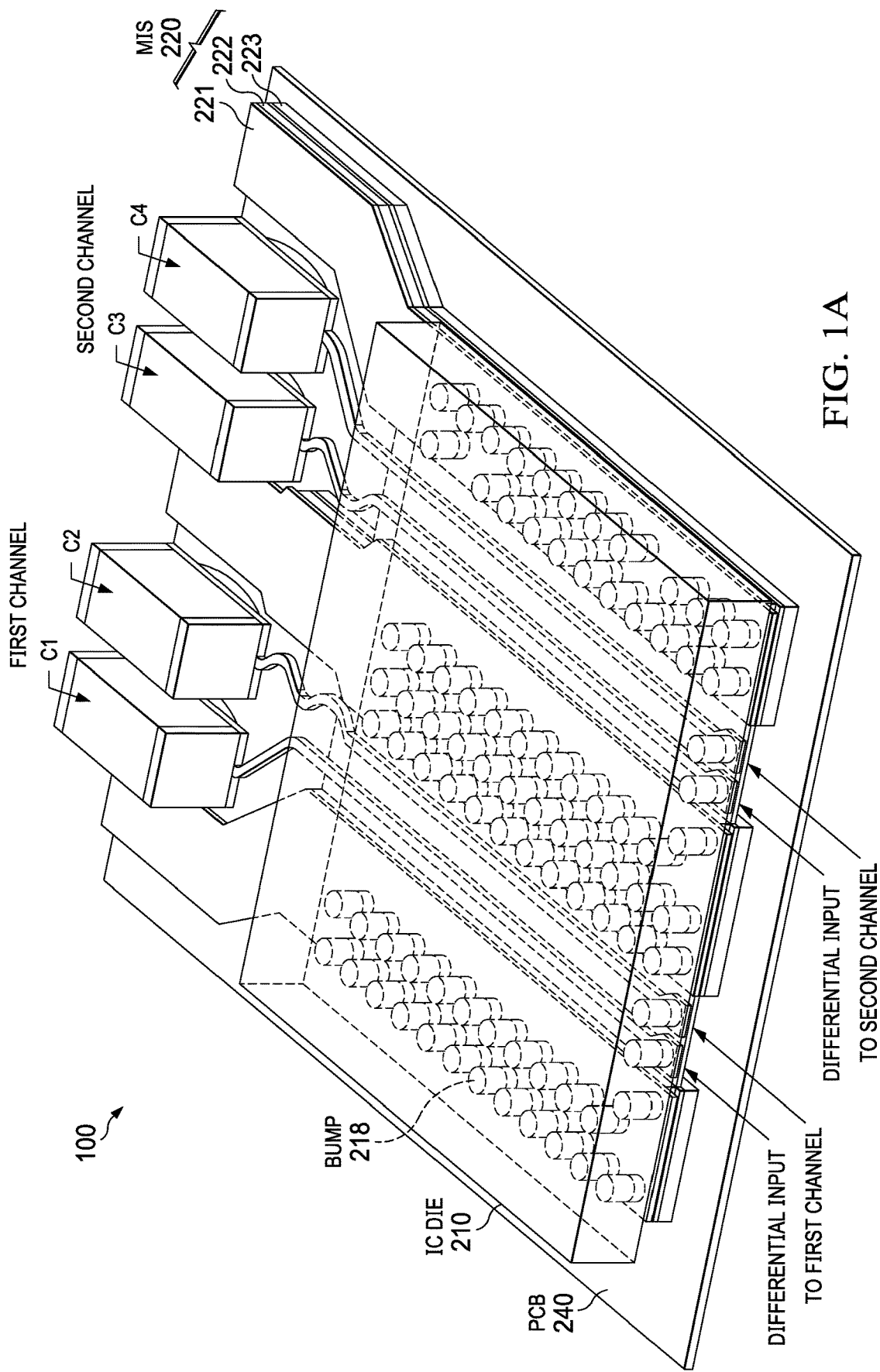
FIG. 1A is a portion of an example packaged MIS QFN-based semiconductor device without its molding that has two channels, and two traces per channel for a total of four traces, each trace with a DC blocking capacitor in series.

Example embodiments are described with reference to the drawings, wherein like reference numerals are used to designate similar or equivalent elements. Illustrated ordering of acts or events should not be considered as limiting, as some acts or events may occur in different order and/or concurrently with other acts or events. Furthermore, some illustrated acts or events may not be required to implement a methodology in accordance with this Disclosure.

FIG. 1A depicts a quarter (25%) of an example packaged MIS QFN-based semiconductor device 100 shown as a 2-channel device with a first channel and a second channel, comprising a MIS 220, with first, second, third and fourth direct current (DC) blocking capacitors C1, C2, C3 and C4, with two DC blocking capacitors per channel to provide a DC blocking capacitor for blocking low frequency components for each of the inputs (one for P trace and one for N trace, or 'legs'). An IC die 210 is attached to the MIS 220 by a bump array with a bump shown as 218. The bump array can comprise copper pillars having solder bumps thereon that are on bond pads of the IC die 210.

Although a mold compound is generally present for disclosed package devices, a mold compound is not shown in FIG. 1A to avoid obscuring features. Also, although not shown, there are also input signals coming from the other end to the IC die 210, processed by the IC die 210, then output from the first and second channel. As shown in the FIG. 1B simplified schematic, the IC die shown as IC die portion 210' has receivers (Rx) $211_0$, $211_1$ and transmitters (Tx) $213_0$, $213_1$ coupled together by a clock data recovery (CDR) circuit $212_0$, $212_1$ that is for reconditioning the input signal and then outputting the reconditioned signal.

The packaged semiconductor device 100 can generally comprise any device that is AC coupled with high speed signal paths that travel through the MIS 220 to and from the IC die 210. For example, a high speed signal conditioner, such as signal re-timer, or a signal repeater used in high performance computing farm applications. Disclosed MIS QFN-based semiconductor devices can be tuned for use generally in any serializer/deserializer (Serdes) or high speed channels.

The MIS 220 includes a signal layer 221 proving a top surface including contact pads that is on a dielectric layer 222 which has through-vias, and a bottom metal layer 223 that provides a ground return path, which can also be used for additional signal traces. Traces on the signal layer 221 routed though vias in the dielectric layer 222 to the bottom metal layer will be the physical bottom of the packaged MIS QFN-based semiconductor device which the customer generally solders (a patterned solder layer is not shown in FIG. 1A, but see the patterned solder layer 219 in FIG. 2 described below) to their printed circuit board (PCB) shown as PCB 240. The patterned solder layer can comprise solder balls that are attached to the bottom metal layer 223 of the MIS package 220 or can comprise solder paste screen printed onto the PCB 240. Although not shown, the MIS substrate 220 can include more than the 3 layers shown.

The signal layer 221 and a bottom metal layer 223 generally comprise copper or a copper alloy. The dielectric layer 222 generally comprises a mold compound as the dielectric material in-between layers 221 and 223. Molding compounds as known in packaging are generally composite materials comprising epoxy resins, phenolic hardeners, silicas, catalysts, pigments, and mold release agents.

The MIS 220 provides a coplanar-waveguide (CPW) microstrip structure. The MIS 220 may be about 80 μm thick, with the signal layer 221 and the bottom metal layer 223 being about 20 μm thick, and the dielectric layer 222 being about 40 μm thick. The DC blocking capacitors generally have a capacitance of 0.05 μF to 2 μF. This capacitance range is above that generally possible for a capacitor on an IC, so that the DC blocking capacitors are generally devices separate from the IC. A typical capacitance for the DC blocking capacitors is 0.22 μF in the 0201 size (0.6×0.3 mm).

FIG. 1B depicts a simplified equivalent circuit for the differential input channels shown in FIG. 1A. For each of the channels there is differential signaling shown as an N trace and a P trace per channel, shown as RX0P and RX0N for the first channel, and RX1P and RX1N for the second channel. The bottom metal layer 223 provides a return path for each of the signal traces to provide impedance matching. The signal itself is differential signaling, i.e., N and P. The gap/width of the traces in the signal layer 221 are specifically chosen to maximize the differential transmission of signals.

At the input to the IC shown as IC die portion 210' are the DC blocking capacitors C1, C2, C3 and C4. The traces on the signal layer 221, vias in the dielectric layer 222, bumps (see FIG. 2 described below) and interconnects in the path to connect to the IC die portion 210' on either side of C1, C2, C3 and C4 are represented by the solid lines shown. On the output side of the IC die portion 210' there are 2 DC blocking capacitors per channel shown as C5, C6, C7 and C8, and the package traces on the signal layer 221, vias in the dielectric layer 222 and bumps (see FIG. 2 described below) and interconnects in the path out from the IC die to the DC blocking caps are also represented by the solid lines shown.

Figure 2:
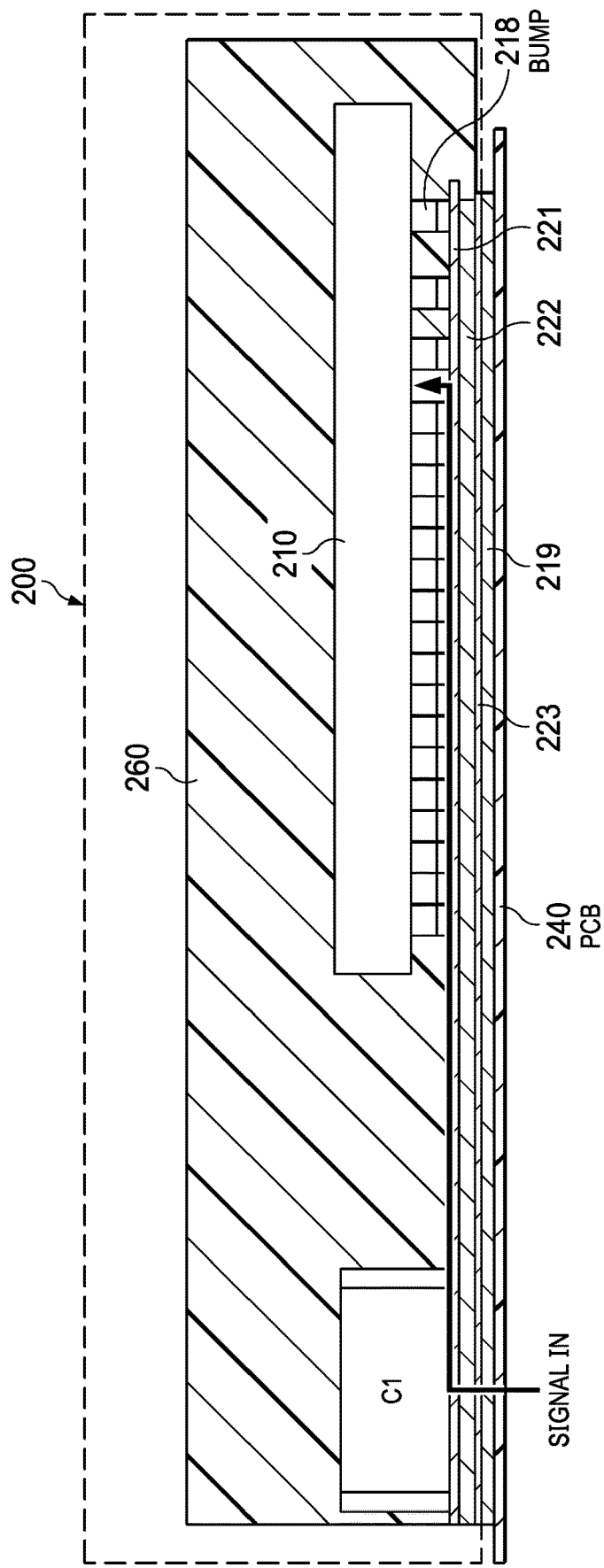
FIG. 2 is a cross sectional view of an example packaged MIS QFN-based semiconductor device with its mold compound showing a signal path in the signal layer for one of the differential inputs of a channel through a DC blocking capacitor shown as C1, according to an example aspect.

FIG. 2 is a cross sectional view of an example packaged MIS QFN-based semiconductor device 200 with its mold compound 260 showing a signal path shown as 'signal in' with an arrow for one of the differential inputs for a channel through the DC blocking capacitor shown as C1. The IC die 210 has a bump array with one of the bumps 218 identified that is FC attached to contact pads on the signal layer 221 of the MIS. Outside the MIS QFN-based semiconductor device 200 there is a patterned solder layer 219 such as solder balls on the bottom metal layer 223 which is exposed from the mold compound 260 on the bottom of the MIS 220 for coupling the bottom metal layer 223 to lands on the PCB 240.

The arrows shown identifies the signal flow from the PCB 240 which is to the patterned solder layer 219, to the bottom metal layer 223, to the vias in the dielectric layer 222, to a node on the signal layer 221, to one plate of C1. After passing through C1, the signal reaches the other plate of C1 then another node on signal layer 221, to the bump 218 (e.g., Cu pillar bump with solder), and finally into the IC die 210.

Figure 3:
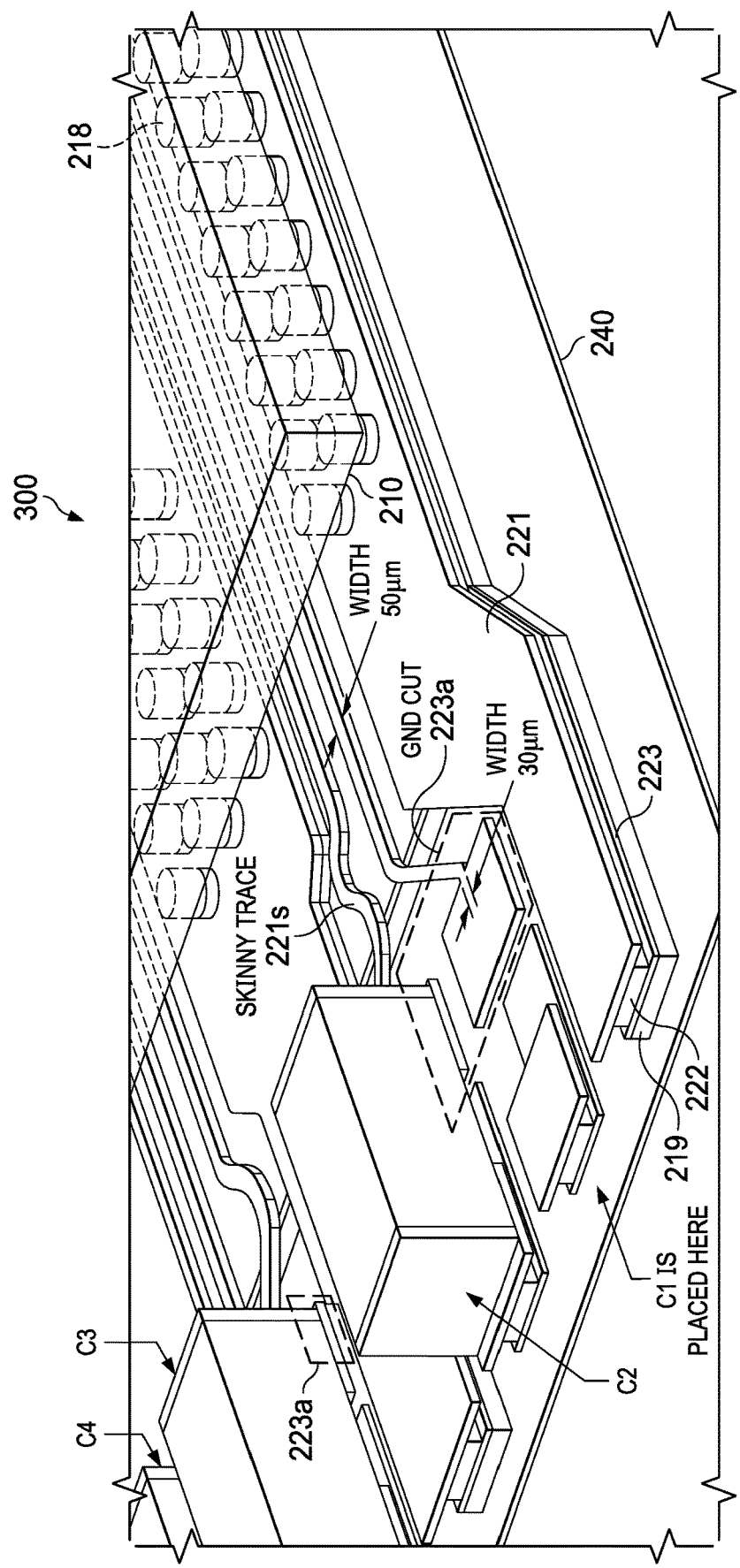
FIG. 3 is a close-up depiction of a portion of example packaged MIS QFN-based semiconductor device without its molding with one DC blocking capacitor removed to show a disclosed ground cut and disclosed 'skinny' trace tuning.

FIG. 3 is a close-up depiction of a portion of example packaged MIS QFN-based semiconductor device 300 without its molding with DC blocking capacitor C1 removed to show a disclosed ground cut 223a and a disclosed skinny trace 221s including over the ground cut 223a, both the ground cuts and skinny traces used for MIS performance tuning. The ground cut regions including the ground cut 223a shown lack the dielectric layer 222 so that the capacitor plate over ground cut 223a has no bottom metal layer underneath. It is noted empty regions in FIG. 3 are filled with dielectric, being mold compound (e.g., see mold compound 260 in FIG. 2 described above).

For example, a nominal line width of 50 μm shown may be used for the signal layer 221, while the skinny trace 221s may have a width of 30 μm as shown, where this particular example arrangement represents the skinny trace 221s having a 40% trace width reduction. A given device performance requirement is met by tuning using the narrowing of traces on the signal layer 221 to provide skinny trace regions and ground cuts 223a, both generally used to meet a device specification, such as insertion loss and return loss at a given operating frequency. For one specific example specification, the specification is <0.5 dB insertion loss at 14 GHz; <15 dB at 14 GHz (pushing to <20 dB), with the device operating at 14 GHz (56 Gbps).

The % range for trace narrowing on the signal layer 221 is 5% to 50%, such as a 25 μm skinny trace 221s in standard 50 μm trace width. As shown in FIG. 3, the width of the traces in the first signal layer 221 may be 50 μm in general. However, when the first signal layer 221 trace comes relatively close to the capacitor pads with one pad over a ground cut region, the trace width is significantly reduced, such as to 30 µm for skinny trace tuning.

One plate of the DC blocking capacitors shown as C2 and C3 can be seen to be over a ground cut 223a. The metal pad on the signal layer 221 in the box shown in FIG. 3 is used for attaching one of the plates of C1 on top, just as C2 and C3 are attached to respective metal pads including one of its plate over a ground cut 223a.

Regarding tuning of the signal layer traces, the traces can be fine-tuned according to the mold compound material properties. The width of traces for the skinny traces of the signal layer 221 can be initially pre-defined by theory and/or experience, and can then be pre-simulated by a 2D field simulator to within several trace dimension candidates, which can then be validated by a full-wave 3D simulation on its end performance. During all of these steps, the mold compound properties in the dielectric layer 222 (its dielectric constant and loss tangent) are input as parameters and the desired characteristic impedance Zo, which is generally 50 ohm for single-ended and 100 ohm differentially.

Regarding the applicable theory, an empirical equation for the Zo of a microstrip line copied below shows how the dielectric constant being one mold compound property as it is the dielectric in dielectric layer 222 impacts the characteristic impedance of the signal layer 221 traces, which is recognized to be important for impedance matching, and thus device performance. The equation for a microstrip line shows the relationship between its characteristic impedance Zo, the dimensions of the traces, where W is the trace width, and d is the via thickness which is set by the thickness of the dielectric layer 222 which fixes the distance between the signal layer 221 and the bottom metal layer 223, and the dielectric constant $\epsilon_e$ of the dielectric layer 222.

$$Z_0 = \begin{cases} \dfrac{60}{\sqrt{\epsilon_e}} \ln\left(\dfrac{8d}{W} + \dfrac{W}{4d}\right) & \text{for } \dfrac{W}{d} \le 1 \\ \dfrac{120\pi}{\sqrt{\epsilon_e}\left[\dfrac{W}{d} + 1.393 + 0.667\ln\left(\dfrac{W}{d} + 1.444\right)\right]} & \text{for } \dfrac{W}{d} \ge 1 \end{cases}$$

Zo range is generally controlled to be 50 ohm single ended and 100 ohm differential as described above. The microstrip line as known in the art of radio frequency (RF) electronics usually has most of its field lines in the dielectric region, here the dielectric layer 222 concentrated between the signal layer 221 and the bottom metal layer 223. The placement of disclosed ground cuts is right beneath one of the capacitor pads so that every DC blocking capacitor has a pad with a ground cut. The same ground cut in the bottom metal layer 223 is also implemented beneath the skinny traces. The DC blocking capacitor pads are generally very capacitive due to their coupling to the ground plane, so the ground cuts reduce the overall capacitive behavior of the package. There are ground cuts also beneath the skinny traces on the signal layer 221 to further increase the inductance of the skinny traces.

Figure 4A:
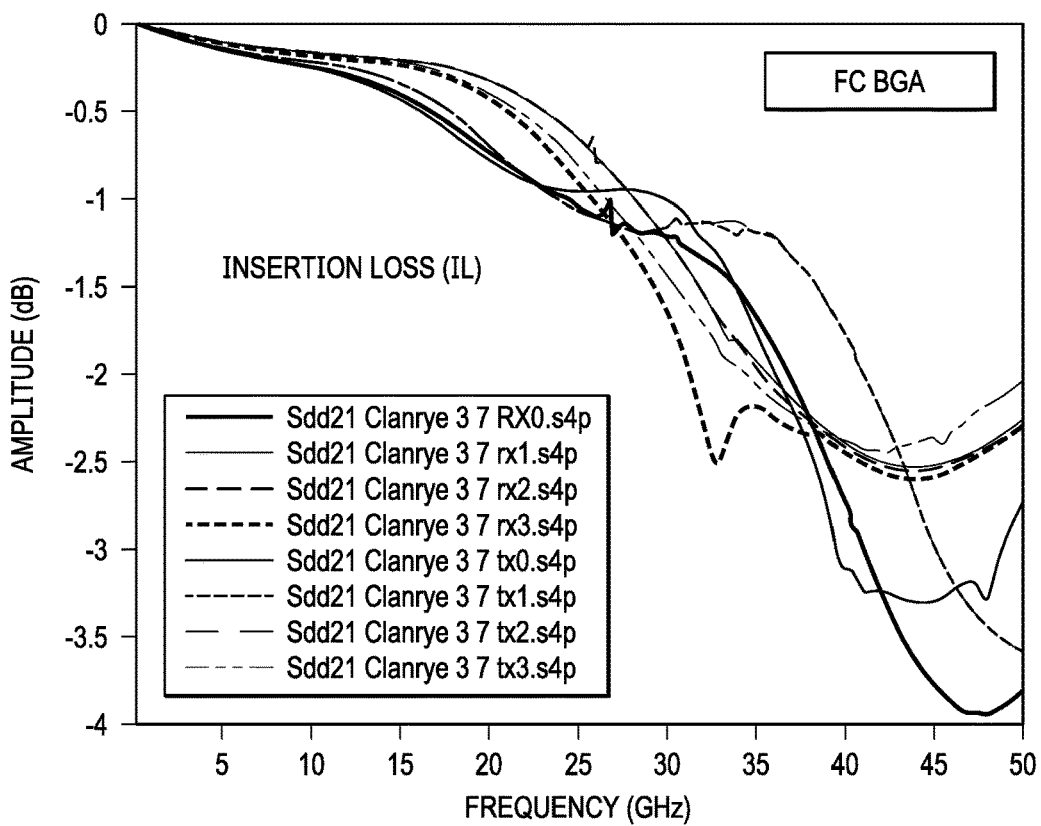
FIGS. 4A-B compare simulated insertion loss between a known FC BGA-based semiconductor device in FIG. 4A and the insertion loss in FIG. 4B for an original MIS QFN-based semiconductor device that lacks disclosed performance tuning, and a MIS QFN-based semiconductor device that includes disclosed performance tuning. The specification to meet was <0.5 dB insertion loss at 14 GHz; <15 dB insertion loss at 14 GHz (pushing to <20 dB), with the device operating at 14 GHz (56 Gbps).
Figure 4B:
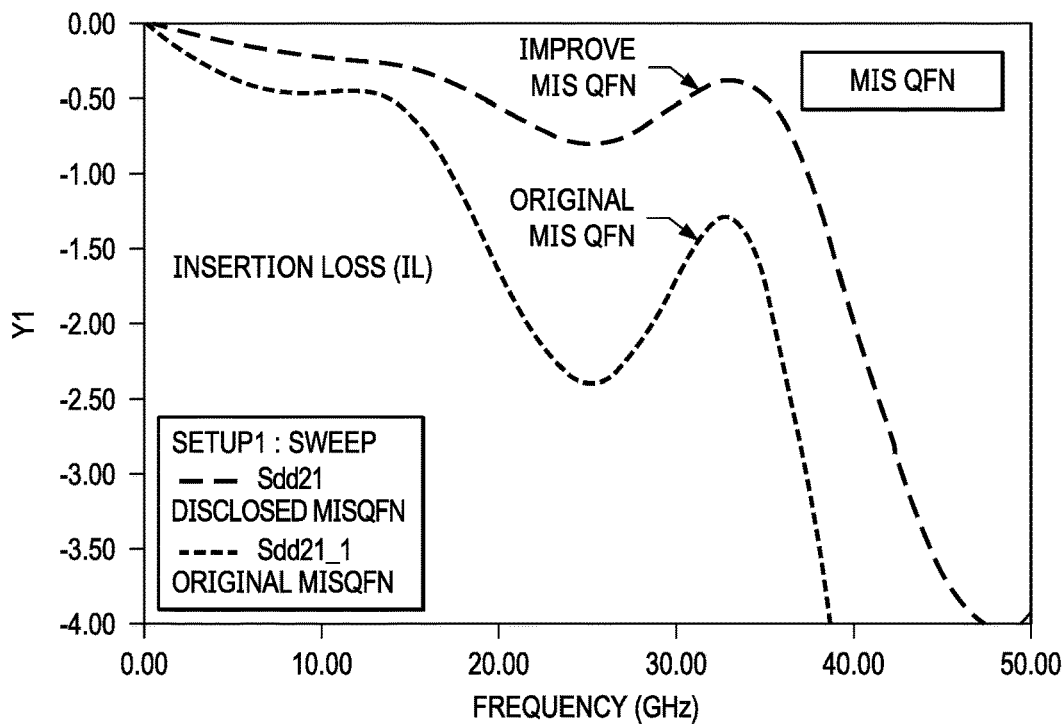

FIGS. 4A-B compare the simulated insertion loss between a known FC BGA-based semiconductor device in FIG. 4A and the insertion loss in FIG. 4B for an original MIS QFN-based semiconductor device that lacks disclosed performance tuning, and a MIS QFN-based semiconductor device that includes disclosed performance tuning. The IC was a data center re-timer used to extend the reach and robustness of long, lossy, crosstalk-impaired high-speed serial links while achieving a bit error rate (BER) of 10 to 15 or less. The device specification was to meet was <0.5 dB insertion loss at 14 GHz; <15 dB at 14 GHz (pushing to <20 dB), with the device operating at 14 GHz (56 Gbps).

Figure 4C:
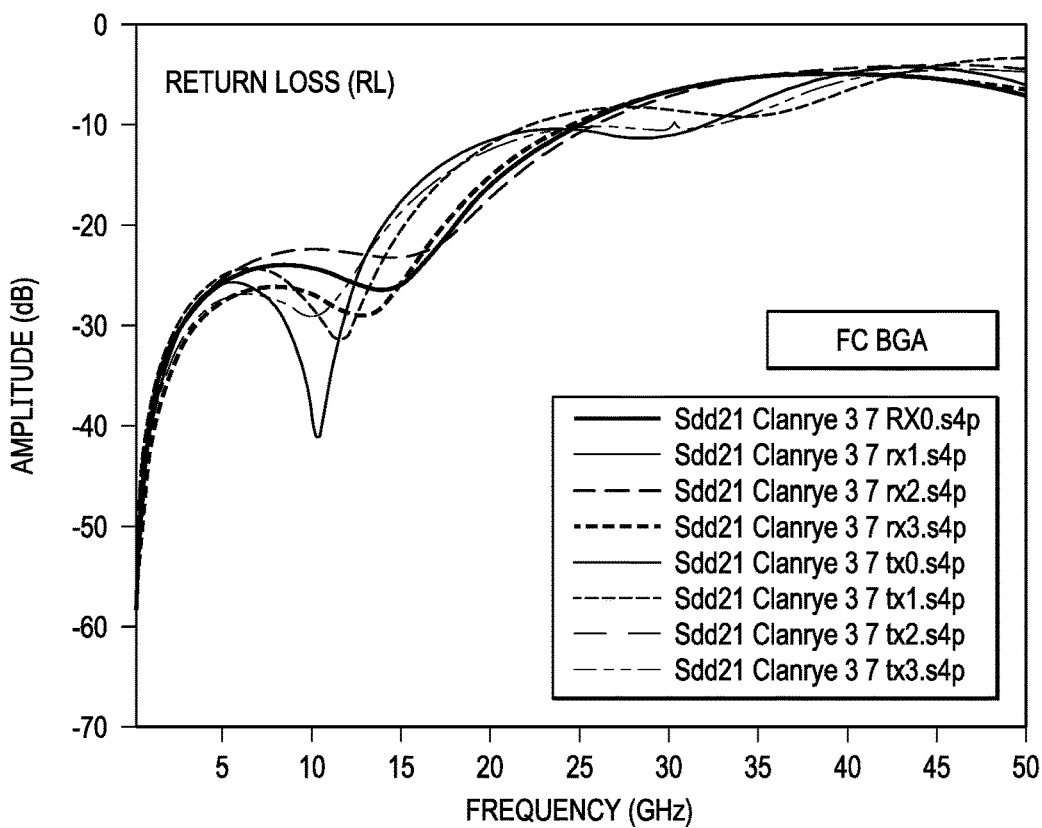
FIGS. 4C-D compare simulated return loss between a known FC BGA based semiconductor device in FIG. 4C and the insertion loss in FIG. 4D for an original MIS QFN-based semiconductor device that lacks disclosed performance tuning, and a MIS QFN-based semiconductor device that includes disclosed performance tuning.
Figure 4D:
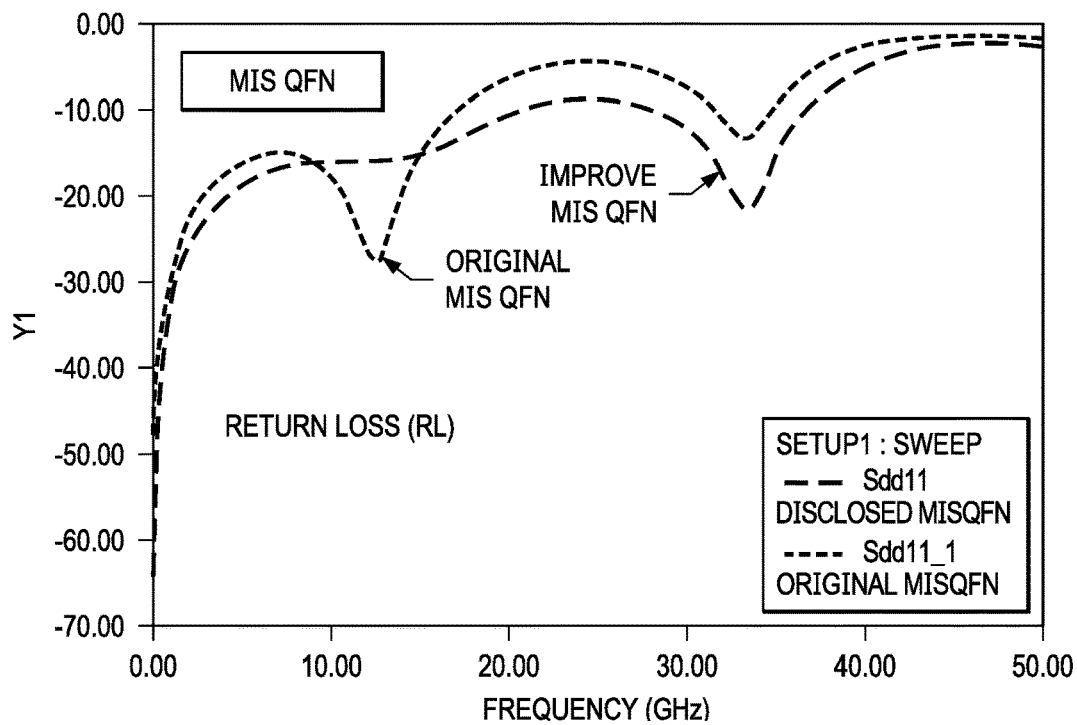

FIGS. 4C-D compare simulated return loss between a known FC BGA-based semiconductor device in FIG. 4C and in FIG. 4D the insertion loss for an original MIS QFN-based semiconductor device that lacks disclosed performance tuning and a MIS QFN-based semiconductor device that includes disclosed performance tuning.

The data in FIGS. 4A-4D demonstrates the problem of the high cost of conventional FC BGA package technology used for high speed devices because of the need to meet high electrical performance (56 Gbps+ data rate) is solved as described herein by developing a physical MIS structure plus in-package DC blocking capacitors using a significantly less expensive MIS QFN technology that can be tuned to deliver similar performance to conventional FC-BGA based packaged devices. Disclosed MIS QFN-based packaged devices provide the performance of conventional FC-BGA package technology with about a 40 to 60% package cost reduction, and a production cycle time reduction of 1 to 2 weeks due to a speedier MIS process flow vs. conventional package substrate manufacturing.

Disclosed embodiments can be integrated into a variety of assembly flows to form a variety of different packaged devices and related products. The assembly can comprise single semiconductor die or multiple semiconductor die, such as PoP configurations comprising a plurality of stacked semiconductor die. A variety of package substrates may be used. The semiconductor die may include various elements therein and/or layers thereon, including barrier layers, dielectric layers, device structures, active elements and passive elements including source regions, drain regions, bit lines, bases, emitters, collectors, conductive lines, conductive vias, etc. Moreover, the semiconductor die can be formed from a variety of processes including bipolar, insulated-gate bipolar transistor (IGBT), CMOS, BiCMOS and MEMS.

Those skilled in the art to which this Disclosure relates will appreciate that many other embodiments and variations of embodiments are possible within the scope of the claimed invention, and further additions, deletions, substitutions and modifications may be made to the described embodiments without departing from the scope of this Disclosure.

The invention claimed is:

1. An apparatus, comprising:
a multi-layer molded interconnect substrate (MIS) having a signal layer including first and second traces for a first channel and first and second traces for a second channel on a dielectric layer with vias, wherein the first and second traces of the first and second channels include narrowed trace regions and a bottom metal layer comprises a patterned layer including a plurality of ground cut regions, at least one of the first and second traces for the first channel and the first and second traces for the second channel being over one of the ground cut regions.

2. The apparatus of claim 1, further comprising:
a first and a second direct current (DC) blocking capacitor in series within the first and second traces of the first channel.

3. The apparatus of claim 2, further comprising:
the first and second DC blocking capacitors each with one plate over one of the ground cut regions.

4. The apparatus of claim 3, wherein the bottom metal layer is under the dielectric layer and provides a ground return path.

5. The apparatus of claim 4, further comprising:
an integrated circuit (IC) including a first differential input channel coupled to receive an output from the first and second DC blocking capacitors.

6. The apparatus of claim 5, further comprising:
a bump array flip chip mounted to contact pads on the signal layer to provide first and second differential output signals.

7. The apparatus of claim 3, further comprising:
an integrated circuit (IC) including a first differential input channel coupled to receive an output from the first and second DC blocking capacitors.

8. The apparatus of claim 7, further comprising:
a bump array flip chip mounted to contact pads on the signal layer to provide first and second differential output signals.

9. The apparatus of claim 2, wherein the bottom metal layer is under the dielectric layer and provides a ground return path.

10. The apparatus of claim 9, further comprising:
an integrated circuit (IC) including a first differential input channel coupled to receive an output from the first and second DC blocking capacitors.

11. The apparatus of claim 10, further comprising:
a bump array flip chip mounted to contact pads on the signal layer to provide first and second differential output signals.

12. The apparatus of claim 2, further comprising:
an integrated circuit (IC) including a first differential input channel coupled to receive an output from the first and second DC blocking capacitors.

13. The apparatus of claim 12, further comprising:
a bump array flip chip mounted to contact pads on the signal layer to provide first and second differential output signals.

14. The apparatus of claim 2, in which the first and second direct current (DC) blocking capacitor within the first and second traces of the first channel provides alternating current (AC) coupling.

15. The apparatus of claim 1, wherein the bottom metal layer is under the dielectric layer and provides a ground return path.

16. The apparatus of claim 1, wherein the vias are electrically conductive.

17. A method of making an apparatus, comprising:
providing a multi-layer molded interconnect substrate (MIS) having a signal layer including first and second traces for a first channel and first and second traces for a second channel on a dielectric layer with vias, wherein the first and second traces of the first and second channels include narrowed trace regions and a bottom metal layer comprises a patterned layer including a plurality of ground cut regions, at least one of the first and second traces for the first channel and the first and second traces for the second channel being over one of the ground cut regions.

18. The method of claim 17, further comprising:
attaching a first and a second direct current (DC) blocking capacitor in series within the first and second traces of the first channel.

19. The method of claim 18, in which:
one plate of each of the first and second DC blocking capacitors is formed adjacent one of the ground cut regions.

20. The method of claim 19, wherein the bottom metal layer is under the dielectric layer and provides a ground return path.

21. The method of claim 20, further comprising:
coupling an integrated circuit (IC) including a first differential input channel to receive an output from the first and second DC blocking capacitors.

22. The method of claim 21, further comprising:
flip chip mounting a bump array flip chip mounted to contact pads on the signal layer to provide first and second differential output signals.

23. The method of claim 19, further comprising:
coupling an integrated circuit (IC) including a first differential input channel to receive an output from the first and second DC blocking capacitors.

24. The method of claim 23, further comprising:
flip chip mounting a bump array flip chip mounted to contact pads on the signal layer to provide first and second differential output signals.

25. The method of claim 18, wherein the bottom metal layer is under the dielectric layer and provides a ground return path.

26. The method of claim 25, further comprising:
coupling an integrated circuit (IC) including a first differential input channel to receive an output from the first and second DC blocking capacitors.

27. The method of claim 26, further comprising:
flip chip mounting a bump array flip chip mounted to contact pads on the signal layer to provide first and second differential output signals.

28. The method of claim 18, further comprising:
coupling an integrated circuit (IC) including a first differential input channel to receive an output from the first and second DC blocking capacitors.

29. The method of claim 28, further comprising:
flip chip mounting a bump array flip chip mounted to contact pads on the signal layer to provide first and second differential output signals.

30. The method of claim 17, wherein the bottom metal layer is under the dielectric layer and provides a ground return path.

31. The method of claim 17, wherein the vias are electrically conductive.

32. An apparatus, comprising:
a multi-layer molded interconnect substrate (MIS) having a signal layer including first and second traces for a first channel and first and second traces for a second channel on a dielectric layer with vias, wherein the first and second traces of the first and second channels include narrowed trace regions and a bottom metal layer comprises a patterned layer including a plurality of ground cut regions, a first portion of the first and second traces spaced from and overlying the bottom metal layer and a second portion of the first and second traces spaced from and not overlying metal portions of the bottom metal layer.

33. The apparatus of claim 32, wherein the narrowed traces regions of the first and second traces do not overly the metal portions of the bottom metal layer.

34. The apparatus of claim 32, wherein the bottom metal layer provides a return path for each of the first and second traces.

35. The apparatus of claim 32, wherein the multi-layer molded interconnect substrate (MIS) is a coplanar-waveguide (CPW) microstrip structure.

36. The apparatus of claim 32, wherein the metal portions of the bottom metal layer form a ground plane.

37. The apparatus of claim 32, wherein the vias are electrically conductive.

38. A method of making an apparatus, comprising:
  providing a multi-layer molded interconnect substrate (MIS) having a signal layer including first and second traces for a first channel and first and second traces for a second channel on a dielectric layer with vias, wherein the first and second traces of the first and second channels include narrowed trace regions and a bottom metal layer comprises a patterned layer including a plurality of ground cut regions, a first portion of the first and second traces spaced from and overlying the bottom metal layer and a second portion of the first and second traces spaced from and not overlying metal portions of the bottom metal layer.

39. The method of claim 38, wherein the narrowed traces regions of the first and second traces do not overly the metal portions of the bottom metal layer.

40. The method of claim 38, wherein the bottom metal layer provides a return path for each of the first and second traces.

41. The method of claim 38, wherein the multi-layer molded interconnect substrate (MIS) is a coplanar-waveguide (CPW) microstrip structure.

42. The method of claim 38, wherein there is no ground plane between the first and second traces.

43. The apparatus of claim 38, wherein the vias are electrically conductive.

* * * * *